(12) United States Patent
Carson et al.

(10) Patent No.: US 6,784,043 B2
(45) Date of Patent: *Aug. 31, 2004

(54) METHODS FOR FORMING ALIGNED FUSES DISPOSED IN AN INTEGRATED CIRCUIT

(75) Inventors: Bryan C. Carson, Meridian, ID (US); Mark L. Hadzor, Boise, ID (US); Lucien J. Bissey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

This patent is subject to a terminal disclaimer.

(21) Appl. No.: 10/367,287

(22) Filed: Feb. 14, 2003

(65) Prior Publication Data

US 2003/0128615 A1 Jul. 10, 2003

Related U.S. Application Data

(63) Continuation of application No. 09/755,848, filed on Jan. 5, 2001, now Pat. No. 6,522,595.

(51) Int. Cl.$^7$ .......................................... H01L 21/8238
(52) U.S. Cl. ...................... 438/209; 438/209; 438/208
(58) Field of Search ................................ 438/958, 132, 438/4, 12, 13; 365/255.7; 257/529; 361/344

(56) References Cited

U.S. PATENT DOCUMENTS

| | | |
|---|---|---|
| 4,233,643 A | 11/1980 | Iverson et al. |
| 4,494,103 A | 1/1985 | Jarosz et al. |
| 4,714,839 A | 12/1987 | Chung |
| 5,420,455 A | 5/1995 | Gilmour et al. |
| 5,532,966 A | 7/1996 | Poteet et al. |
| 5,914,524 A | 6/1999 | Komenaka |
| 5,966,339 A | 10/1999 | Hsu et al. |
| 5,986,321 A | 11/1999 | Froehner |
| 6,008,716 A | 12/1999 | Kokubun |
| 6,372,554 B1 * | 4/2002 | Kawakita et al. ........... 438/132 |

* cited by examiner

Primary Examiner—David Nelms
Assistant Examiner—Thinh T Nguyen
(74) Attorney, Agent, or Firm—Graybeal Jackson Haley LLP

(57) ABSTRACT

An integrated circuit includes a first conductive layer, an insulator layer disposed on the first conductive layer, and a second conductive layer disposed on the insulator layer. A first fuse is disposed in the first conductive layer and provides a first signal, and a second fuse is disposed in the second conductive layer in alignment with the first fuse and provides a second signal.

23 Claims, 7 Drawing Sheets

METHODS FOR FORMING ALIGNED FUSES DISPOSED IN AN INTEGRATED CIRCUIT

This application is a continuation of application Ser. No. 09/755,848, filed Jan. 5, 2001, now U.S. Pat. No. 6,522,595.

TECHNICAL FIELD

The invention relates generally to integrated circuits (ICs), and more particularly to an IC that includes a fuse bank having aligned fuses, such as laser fuses, and methods for forming and programming the fuses. By including aligned fuses, the fuse bank occupies significantly less area of the IC than if it included fuses laid out side by side.

BACKGROUND OF THE INVENTION

Makers of today's electronic equipment consistently pressure IC manufacturers to: (1) reduce the sizes of ICs, and (2) maintain or increase the number and complexity of the functions the ICs perform. Therefore, IC designers continue to explore and develop new techniques for reducing the areas of IC dies without reducing the ICs' capabilities.

FIG. 1 is a block diagram of an IC 10, which includes an array 12 of memory cells and redundancy circuitry for replacing defective ones of the cells. The array 12 includes a matrix array 14 of matrix memory cells that store data and that are arranged in rows and columns. An address generator 18 receives an external address on the ADDRESS bus and generates therefrom an internal row address on a bus 20. This internal address identifies a respective row of matrix cells in the array 14. A matrix circuit 21 includes matrix row decoders $22_0$–$22_n$—one for each row in the matrix array 14—for firing the respective matrix rows.

In operation of the IC 10, the decoders $22_0$–$22_n$ receive a conventional address PRECHARGE signal before the generator 18 generates the row address. Next, the row decoders $22_0$–$22_n$ receive and decode the row address on the bus 20. Then, the row decoder 22 corresponding to the addressed row fires the word line WL of the addressed row. For example, if the address generator 18 addresses row 0 in the matrix array 14, then the row 0 decoder $22_0$ fires the word line WL0 via a firing terminal $25_0$.

Unfortunately, one or more matrix cells in a row of the matrix array 14 may be defective and thus unable to reliably store data. For example, the respective word line WL or a part of the defective matrix cell or cells may be short-circuited to other nodes in the IC 10.

To prevent a defective matrix cell from rendering the entire IC 10 unusable, the array 12 includes an array 23 of redundant memory cells, and the IC 10 includes a redundant circuit 24 for mapping a redundant cell to the address of a defective matrix cell. In one embodiment, the redundant cells are arranged in rows and columns, and the circuit 24 maps a redundant row to the address of a matrix row containing one or more defective matrix cells. The circuit 24 includes a programmable portion 26 and redundant row decoders $28_0$–$28_x$—one decoder for each row in the redundant array 23—for firing the respective redundant rows. The programmable portion 26 includes a programmable redundancy address circuit 30 and a programmable redundancy control circuit 32. Often, the circuits 30 and 32 contain laser-programmable fuses that are laid out side by side in a lower layer of the IC 10.

If one finds a defective row in the matrix array 14, then he programs the circuit 24 to map a redundant row in the array 23 to the address of the defective matrix row. For example, suppose that matrix row 1 is defective and one wishes to replace it with the redundant row 0. To do this, he programs the redundancy address circuit 30 to address the redundant row 0—and thus to activate the redundant row decoder $28_0$—whenever the address generator 18 generates the address of the matrix row 1. He also programs the redundancy control circuit 32 to enable the redundant row decoder $28_0$. Therefore, in response to the redundant-row-0 address from the circuit 30 and an enabling control signal from the circuit 32, the redundant row decoder $28_0$ fires the redundant word line RWL0 via a firing terminal $29_0$.

A problem with the matrix circuit 21, however, is that it continues to fire the word line WL of a defective matrix row even after one has programmed the redundant circuit 24 to replace the defective row with a redundant row. This firing may cause a malfunction that is not fixed by the mapping of the redundant row to the address of the defective row. For example, if the word line WL of the defective row is shorted to another word line or to a cell plate, then firing WL may cause data errors or other malfunctions.

FIG. 2 is a block diagram of an IC 40, which is similar to the IC 10 of FIG. 1 except that the matrix circuit 21 does not fire a defective matrix row. The matrix circuit 21 includes a programmable matrix control circuit 42. If one finds a defective matrix row in the array 14, then in addition to programming the redundant circuit 24 as discussed above in conjunction with FIG. 1, he programs the circuit 42 to disable the corresponding row decoder 22 from firing the word line WL of the defective row. For example, if the matrix row 0 is defective, then one programs the control circuit 42 to disable the row decoder $22_0$. Thus, even if the address generator 18 generates the address of the matrix row 0, the disabled row decoder $22_0$ does not fire the word line WL0.

Often, the matrix control circuit 42 includes laser fuses that are disposed in the same layer of the IC 40 as the fuses of the redundant circuit 24. Therefore, the circuit 42 tends to increase the die area, and thus the overall size, of the IC 40.

FIG. 3 is a cutaway cross-sectional view of a semiconductor structure 50, which includes a stacked fuse 51. The structure 50 includes an upper fuse element 52 disposed on an insulator layer 54, and includes a lower fuse element 56 disposed beneath the insulator layer 54 and in alignment with the upper fuse element 52. The fuse elements 52 and 56 are electrically connected in parallel by conductive vias 58 and 59 to form the stacked fuse 51. Compared to a single fuse element, the stacked fuse 51 has approximately the same width, and thus occupies approximately the same die area, but has approximately twice the current-carrying capacity. During programming of the stacked fuse 51, one uses a laser beam to cut both fuse elements 52 and 56.

Unfortunately, including stacked fuses in the IC 40 would not reduce the number of fuses in the circuits 30, 32, and 42, and thus would not reduce the die area of the IC 40. In fact, including stacked fuses in the IC 40 would increase the manufacturing complexity of and could add a conductive layer to the IC 40.

SUMMARY OF THE INVENTION

In one aspect of the invention, an IC includes a first conductive layer, an insulator layer disposed on the first conductive layer, and a second conductive layer disposed on the insulator layer. A first fuse is disposed in the first conductive layer and provides a first signal, and a second fuse is disposed in the second conductive layer in alignment with the first fuse and provides a second signal.

Such an IC includes fuses that are disposed one on top of the other. A fuse bank including such fuses occupies significantly less die area than a fuse bank including only side-by-side fuses. Therefore, an IC having such a fuse bank can be significantly smaller than an otherwise equivalent IC having a side-by-side fuse bank.

DETAILED DESCRIPTION OF THE INVENTION

Figure 4A:
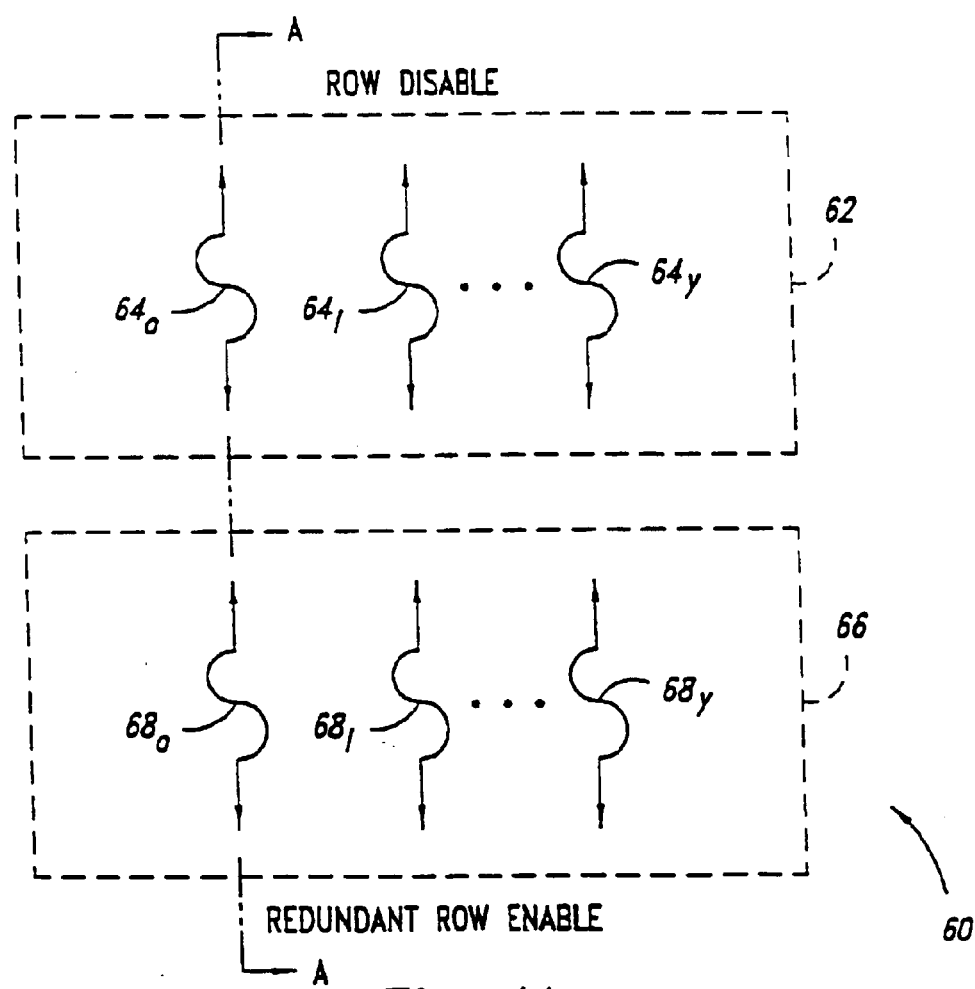
FIG. 4A is a schematic diagram of a fuse bank according to an embodiment of the invention.

FIG. 4A is a schematic diagram of a fuse bank 60 according to an embodiment of the invention. The fuse bank 60 includes an upper sub-bank 62 of fuses $64_0-64_y$, which are disposed side by side in a first conductive layer. The fuse bank 60 also includes a lower sub-bank 66 of fuses $68_0-68_y$, which are disposed side by side in a second conductive layer that is beneath the first conductive layer. The terminals of the fuses 64 and 68 are respectively coupled to nodes that are omitted from FIG. 4A for clarity. The fuses 64 in the upper sub-bank 62 are preferably vertically aligned with the fuses 68 in the lower sub-bank 66 such that the area of the fuse bank 60 is reduced by approximately half as compared to a fuse bank having all of the fuses 64 and 68 disposed in the same layer. For example, the fuse $64_0$ is disposed above and in alignment with the fuse $68_0$. In one embodiment, the fuses $64_0$ and $68_0$ are aligned along a line that is normal to the surface of the layer in which the fuse $64_0$ is formed. In another embodiment, these fuses are aligned such that one can direct a laser beam at the fuse $64_0$, cut through the fuse $64_0$, and then cut through the fuse $68_0$ without redirecting the beam. Because it is difficult in such an embodiment to cut the fuse $64_0$ without cutting the fuse $68_0$, the circuitry connected to the fuses $64_0$ and $68_0$ is designed such that the fuses $64_0$ and $68_0$ can always have the same state (either opened or closed). But the fuses $64_0$ and $68_0$ can have other relative alignments so long as one can cut the lower fuse $68_0$ with a laser beam after he cuts the upper fuse $64_0$.

Figure 3:
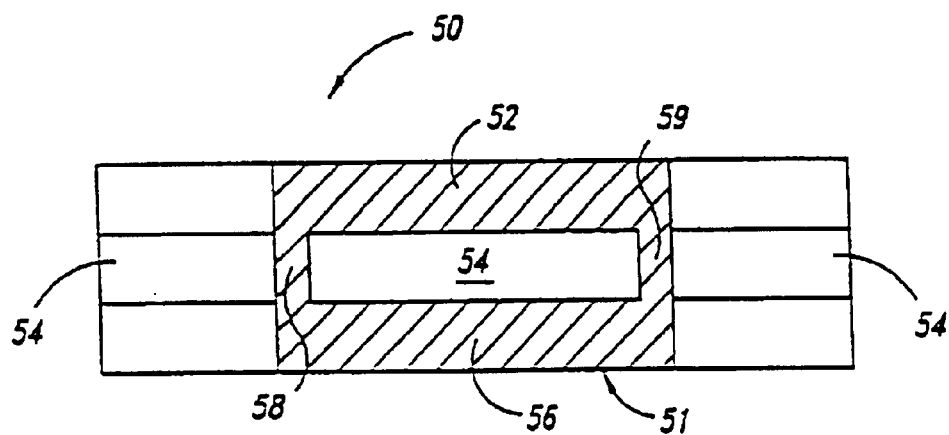
FIG. 3 is a cutaway cross-sectional view of a conventional stacked fuse.
Figure 4B:
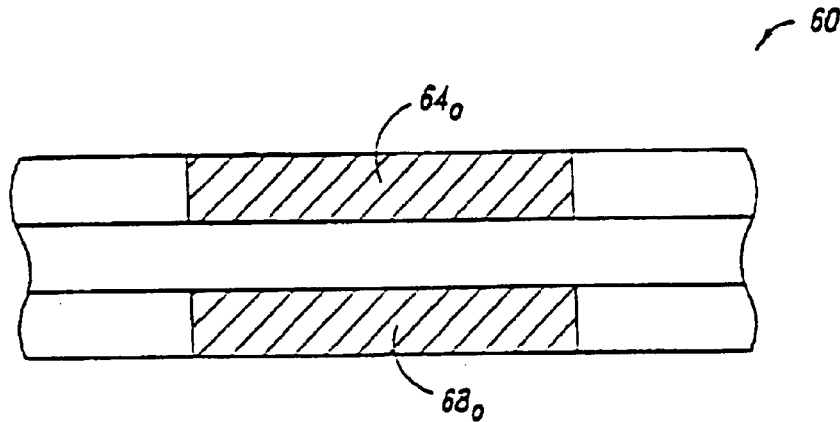
FIG. 4B is a cutaway cross-sectional view of an embodiment of the fuse bank of FIG. 4A.

FIG. 4B is a cutaway cross-sectional view of the fuse bank 60 taken along lines A—A of FIG. 4A. As discussed above, the fuse $64_0$ is disposed above and in alignment with the fuse $68_0$. Unlike the stacked fuse 51 of FIG. 3, the fuses $64_0$ and $68_0$ are not electrically connected in parallel, but instead are connected to provide different signals or to provide the same signal to different nodes. For example, in one embodiment, the terminals of the fuse $64_0$ are connected to respective nodes that are different than the nodes to which the terminals of the fuse $68_0$ are connected. In another embodiment, one terminal of each of the fuses $64_0$ and $68_0$ is connected to a common node, and the other terminals are connected to different nodes.

The fuses 64 and 68 of the fuse bank 60 can be formed from any suitable conductive material such as aluminum or polysilicon. Furthermore, the fuse bank 60 may have more than two sub-banks disposed one atop the other.

In a related embodiment, the fuses 64 In the upper sub-bank 62 are designed to open if exposed to a laser beam that is tuned to a first frequency, and the fuses 68 in the lower sub-bank 66 are designed to open if exposed to a laser beam that is tuned to a second frequency. Therefore, one can cut the fuse $64_0$ without cutting or damaging the fuse $68_0$. If It is desired to open both of the fuses $64_0$ and $68_0$, then after cutting the fuse $64_0$ with a laser beam having the first frequency, one cuts the fuse $68_0$ with a laser beam having the second frequency. This allows one to design the circuitry connected to the fuses $64_0$ and $68_0$ for three possible fuse states: both closed, $64_0$ opened and $68_0$ closed, and both opened. Conductive materials suitable and lasers suitable for this embodiment of the fuses 64 and 68 are known in the art.

Figure 2:
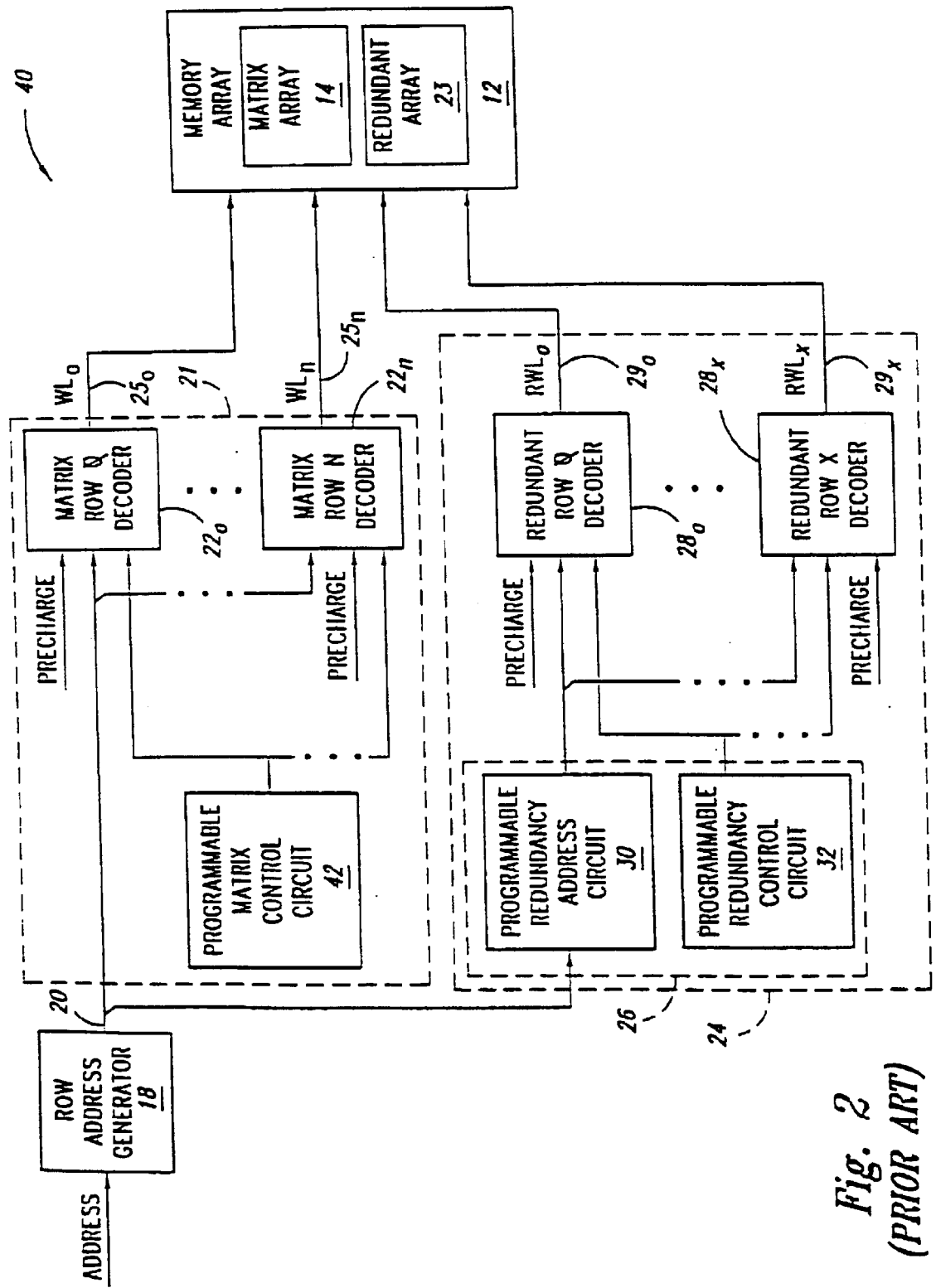
FIG. 2 is a block diagram of a conventional IC that does not fire a defective matrix cell after the defective cell is replaced with a redundant cell.
Figure 5:
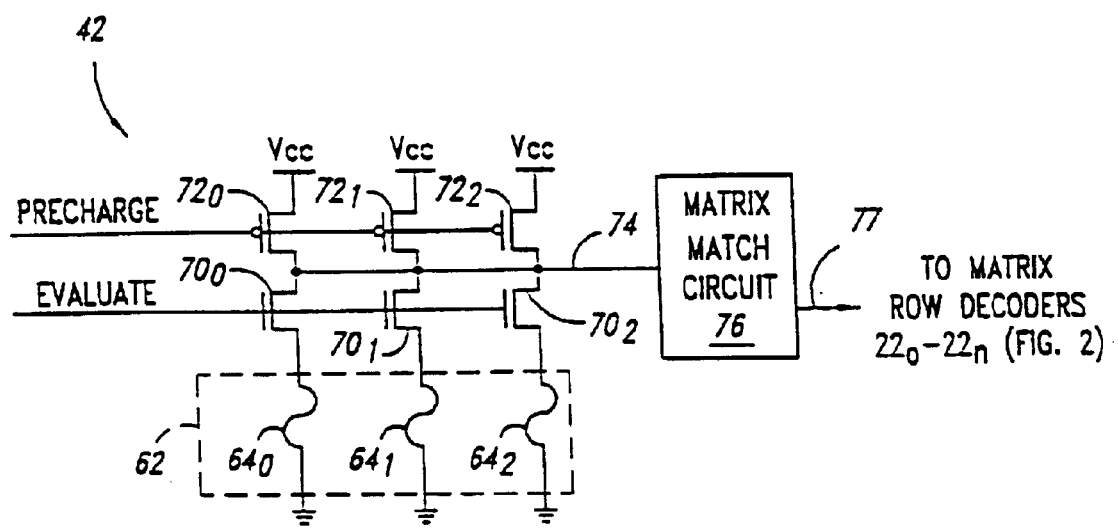
FIG. 5 is a schematic diagram of the matrix control circuit of FIG. 2 according to an embodiment of the invention.

FIG. 5 is a schematic diagram of an embodiment of the programmable matrix circuit 42 of FIG. 2 according to the invention. The circuit 42 includes the sub-bank 62 of the fuse bank 60 of FIGS. 4A and 4B. In this embodiment, the sub-bank 62 includes three fuses $64_0-64_2$, although in other embodiments the sub-bank 62 may include more or fewer fuses. Each of the fuses 64 is serially connected to a respective complimentary pair of an NMOS transistor 70 and a PMOS transistor 72. The gates of the NMOS transistors 70 are all coupled to receive an EVALUATE signal, and the gates of the PMOS transistors 72 are coupled to receive the PRECHARGE signal. The drains of each pair of transistors 70 and 72 are coupled to a respective line of a bus 74, which connects the transistors 70 and 72 to a matrix match circuit 76. The circuit 76 generates control signals on a matrix control bus 77 to enable/disable the respective matrix row decoders 22 of FIG. 2.

During operation of the matrix circuit 42, all of the transistors 70 and 72 function as switches and are initially off. Next, PRECHARGE transitions from logic 1 to logic 0 to turn on the transistors 72. Because the transistors 70 are turned off, the active transistors 72 charge the respective lines of the bus 74 to Vcc, i.e., logic 1. Then, PRECHARGE transitions back to logic 1 to turn off the transistors 72. Next, EVALUATE transitions from logic 0 to logic 1 to turn on all of the transistors 70. If a fuse 64 is closed, then the respective transistor 70 pulls down the respective line of the bus 74 to logic 0. For example, if the fuse $64_0$ is closed, then the active transistor $70_0$ discharges the respective line of the bus 74 to ground via the fuse $64_0$, thus transitioning the bus line from logic 1 to logic 0. Conversely, if a fuse 64 is opened, then the respective transistor 70 cannot pull down the respective bus line, which thus retains its precharged level of logic 1. For example, if the fuse $64_0$ is opened, then the source of the active transistor $70_0$ floats electrically such that the transistor $70_0$ cannot discharge the respective bus line to ground. If all of the fuses $64_0-64_2$ are closed, then all of the lines of the bus 74 are at logic 0 and the matrix match circuit 76 enables all of the row decoders 22 (FIG. 2). Conversely, if one or more of the fuses $64_0$–$64_2$ are opened, then some or all of the lines of the bus 74 retain their precharged level of logic 1. The matrix match circuit 76 decodes the pattern of logic 1s and logic 0s on the lines of the bus 74, and using conventional logic, disables the appropriate row decoder or decoders 22.

In an embodiment of the circuit 42 that can disable at most one matrix row at a time, the three fuses $64_0$–$64_2$ allow the circuit 42 to handle up to seven matrix rows, and thus up to seven matrix row decoders 22 (FIG. 2). For example, if the circuit 42 handles seven matrix rows, then there are seven unique disable possibilities in that the circuit 42 can disable any one of the matrix rows. There is also an additional possibility that the circuit 42 disables none of the matrix rows. This is a total of eight possibilities, which is the maximum number (2³) that the three fuses $64_0$–$64_2$ can provide for. Of course, one may wish to design the circuit 42 to handle more than seven matrix rows or to disable more than one matrix row at a time. To do this, he can increase the number of fuses 64, transistors 70 and 72, and lines of the bus 74, and can redesign the circuit 76 to accommodate the additional bus-line inputs according to conventional circuit-design principles.

Figure 6:
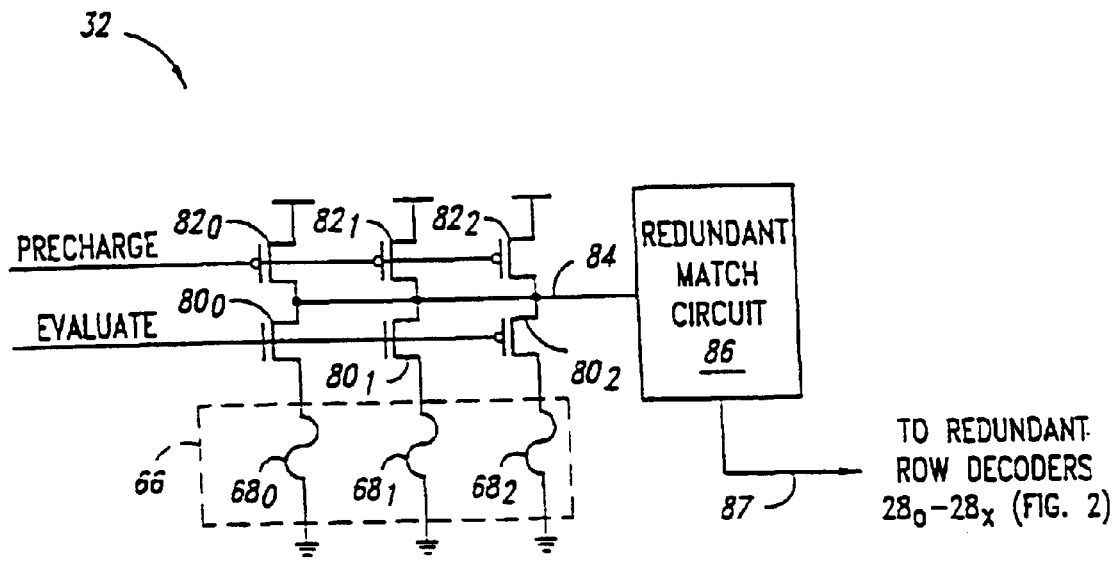
FIG. 6 is a schematic diagram of the redundancy control circuit of FIG. 2 according to an embodiment of the invention.

FIG. 6 is a schematic diagram of an embodiment of the redundancy control circuit 32 of FIG. 2 that is similar to the matrix control circuit 42 of FIG. 5. The circuit 32 includes the lower sub-bank 66 of the fuse bank 60 of FIG. 4A. In this embodiment, the sub-bank 66 includes three fuses $68_0$–$68_2$, although more or fewer fuses can be included. The circuit 32 also includes complementary pairs of NMOS and PMOS transistors 80 and 82, which precharge and evaluate the respective lines of a bus 84 in response to PRECHARGE and EVALUATE, respectively, according to the respective states of the fuses $68_0$–$68_2$. The circuit 32 also includes a redundant match circuit 86, which generates control signals on a redundant control bus 87 to enable/disable the respective redundant row decoders 28 of FIG. 2.

During operation of the circuit 32, the transistors 80 and 82 operate in a manner similar to the transistors 70 and 72 of FIG. 5. If all of the fuses 68 are closed, then the redundant match circuit 86 disables all of the redundant row decoders 28, and thus all of the redundant rows. If one or more of the fuses are opened, then the circuit 86 decodes the pattern of logic 1s and logic 0s on the lines of the bus 84, and using conventional logic, enables the appropriate row decoder or decoders 28. If the circuit 86 is designed to enable one redundant row decoder 28 at a time, the three fuses $68_0$–$68_2$ allow the circuit 86 to handle up to seven redundant row decoders 28, and thus up to seven redundant rows. But the circuit 32 can be modified according to conventional circuit-design principles to handle more redundant row decoders or to enable more than one decoder 28 at a time.

Referring to FIGS. 2, 5, and 6, an embodiment of the IC 40 is discussed that illustrates the advantages provided by the fuse bank 60 of FIGS. 4A and 4B. In this embodiment, the IC 40 includes seven row decoders $22_0$–$22_6$ and the matrix control circuit 42 of FIG. 5. Furthermore, the IC 40 includes one redundant row decoder $28_0$ and a slightly modified version of the redundancy control circuit 32 of FIG. 6. In the modified circuit 32, the redundant match circuit 86 is designed to enable the redundant row decoder $28_0$ if at least one of the fuses $68_0$–$68_2$ is opened.

Figure 1:
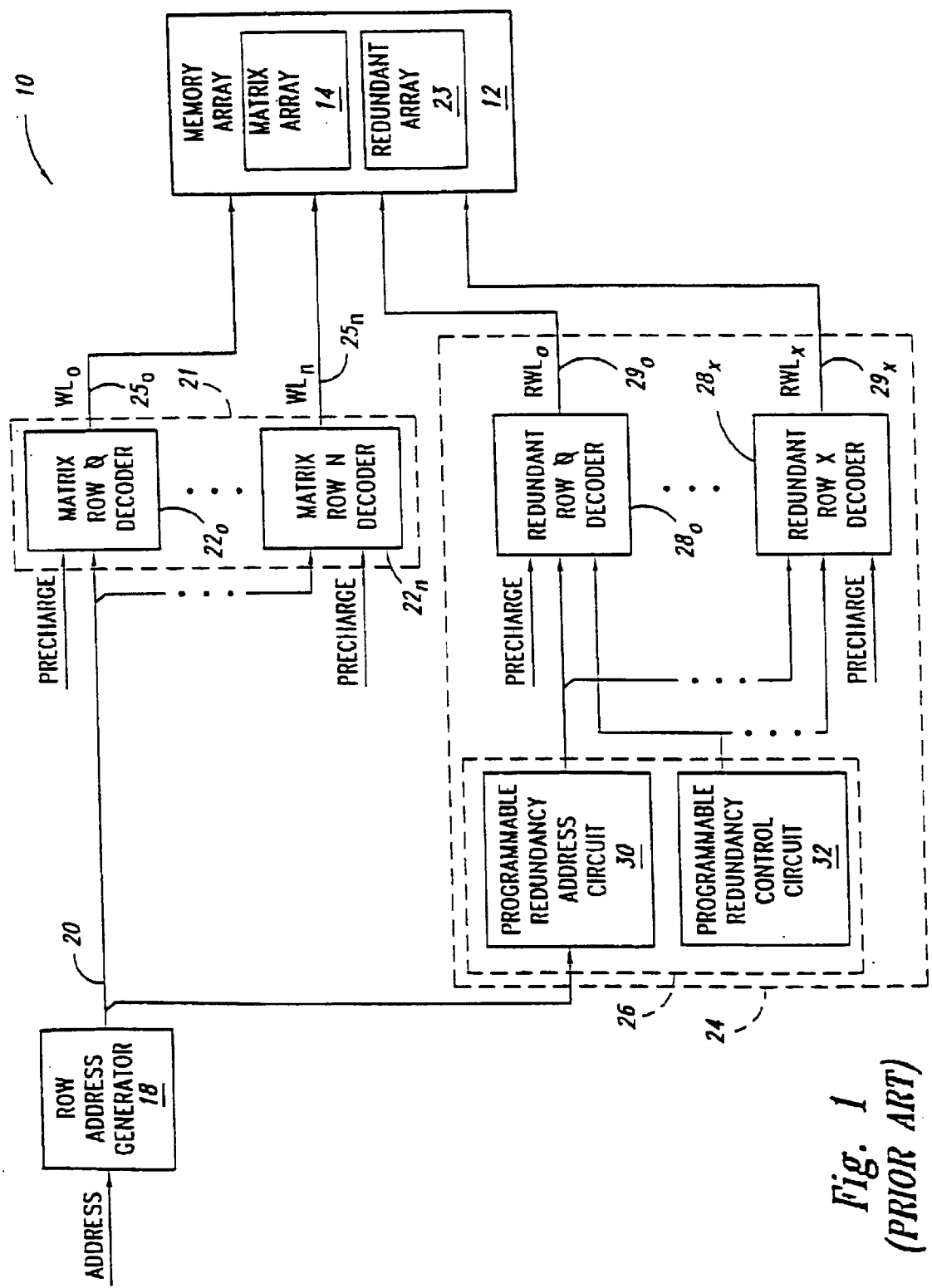
FIG. 1 is a block diagram of a conventional IC that fires a defective matrix cell even after the defective cell is replaced with a redundant cell.

For example purposes, suppose that one of the matrix rows in the matrix array 14 is defective, and that one must open the fuse $64_0$ (FIG. 5) so that the matrix match circuit 76 disables the defective row. By cutting the fuse $64_0$ with a laser beam and then cutting the fuse $68_0$—which is beneath and aligned with the fuse $64_0$—with the same laser beam, one disables the respective matrix row decoder 22 from firing the defective matrix row and enables the redundant row decoder $28_0$ to fire the corresponding redundant row in its place. Thus, including one sub-bank 62 of the fuse bank 60 in the circuit 42 and the other sub-bank 66 in the circuit 32 allows one to program both the redundant and matrix control circuits 32 and 42 by cutting both fuses 64 and 68 in one or more aligned fuse pairs. Furthermore, this allows the IC 40 to have both the ability to disable a defective matrix row and the smaller layout area of the IC 10 of FIG. 1. In another embodiment that gives similar advantages, the fuses 64 are designed to open if exposed to a laser beam tuned to a first frequency and the fuses 68 are designed to open if exposed to a laser beam tuned to a second frequency. This embodiment provides more design flexibility for the circuits 32 and 42 because a fuse 64 of a fuse pair can be opened and the fuse 68 of the pair can remain closed as discussed above in conjunction with FIGS. 4A and 4B.

Still referring to FIGS. 5 and 6, although the circuit 42 is described as incorporating the upper sub-bank 62 of the fuse bank 60 and the circuit 32 is described as incorporating the lower sub-bank 65, the circuit 42 may incorporate the lower sub-bank 66 and the circuit 32 may incorporate the upper sub-bank 62. Furthermore, although the matrix circuit 21 and the redundancy circuit 24 are described as accessing rows of matrix and redundant cells, respectively, the circuits 21 and 24 can be designed to access columns or other groupings of matrix and redundant cell. Or, the circuits 21 and 24 can be designed to access individual matrix and redundant cells. Additionally, although described as being included in the circuits 21 and 24, the fuse bank 60 may be used in other types of circuits.

Figure 7:
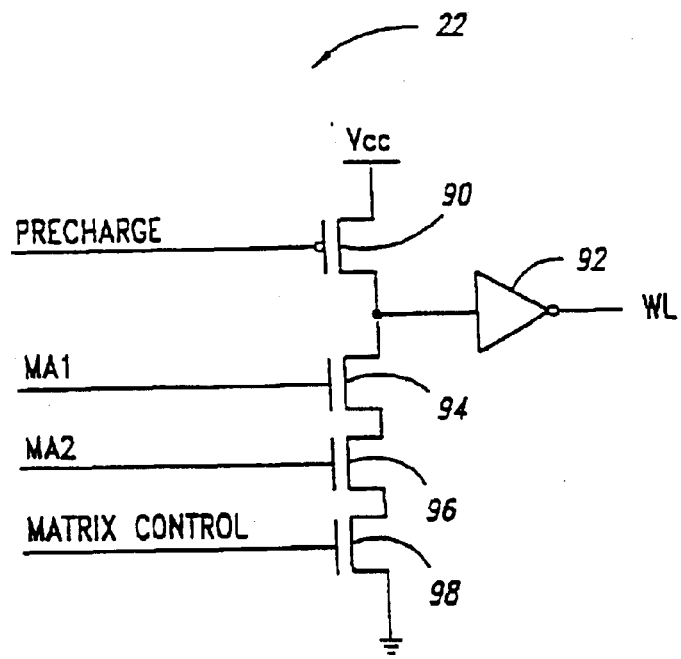
FIG. 7 is a schematic diagram of a matrix row decoder of FIG. 2 according to an embodiment of the invention.

FIG. 7 is a schematic diagram of an embodiment of a matrix row decoder 22 of FIG. 2 according to the invention. In this embodiment, the matrix circuit 21 can handle up to four matrix rows, and thus four row decoders 22. But one can modify the decoder 22 according to conventional circuit design principles so that the circuit 21 can accommodate more than four matrix rows. The decoder 22 includes a PMOS transistor 90 having a gate coupled to receive PRECHARGE, an inverter 92 for firing the word line WL, and three serially connected NMOS transistors 94, 96 and 98. The transistors 94 and 96 receive matrix address bits MA1 and MA2, respectively, from the address bus 20 (FIG. 2), and the transistor 98 receives a respective MATRIX CONTROL signal from the matrix match circuit 76 (FIG. 5).

During testing of the IC 40 (FIG. 2), if the matrix row corresponding to the row decoder 22 is functional, then one enables the decoder 22 by programming the matrix control circuit 42 to generate MATRIX CONTROL equal to logic 1. Conversely, if the matrix row is defective, then one disables the decoder 22 by programming the circuit 42 to generate MATRIX CONTROL equal to logic 0.

In operation, before the row address generator 18 (FIG. 2) generates the row address on the bus 20, PRECHARGE transitions from logic 1 to logic 0 to turn on the transistor 90. The NMOS transistors 94 and 96 (and possibly the transistor 98) are off so that the transistor 90 charges the input terminal of the inverter 92 to logic 1. PRECHARGE then transitions back to logic 1 to turn off the transistor 90, and the address generator 18 generates an address. If MATRIX CONTROL equals logic 0, then the decoder 22 cannot fire the word line WL regardless of the values of the address bits MA1 and MA1. Specifically, the logic 0 turns off the transistor 98, which acts as an open circuit between the input terminal of the inverter 92 and ground. This open circuit causes the input of the inverter 92 to remain at logic 1, which causes the inverter 92 to generate inactive logic Q on the row line WL. If MATRIX CONTROL equals logic 1, but none or only one of the address bits MA1 and MA2 equal to logic 1, then at least one of the transistors 94 and 96 is turned off. Therefore, there is still an open circuit between the input terminal of the inverter 92 and ground, and the inverter 92 still generates inactive logic 0 on WL. Conversely, if MATRIX CONTROL, MA1, and MA2 equal logic 1, then all three transistors 94, 96, and 98 are on and together pull the input of the inverter 92 to ground. This causes the inverter 92 to fire the row by generating active logic 1 on the word line WL.

Figure 8:
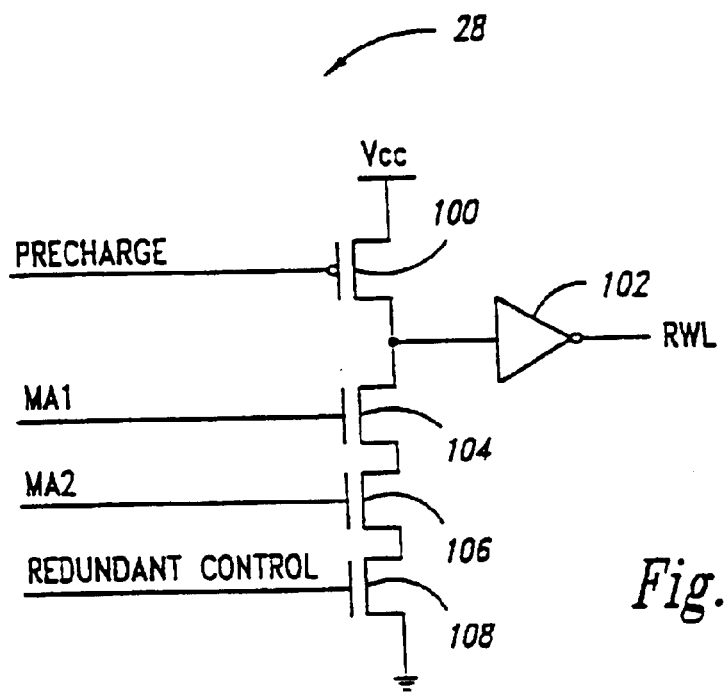
FIG. 8 is a schematic diagram of a redundant row decoder of FIG. 2 according to an embodiment of the invention.

FIG. 8 is a schematic diagram of an embodiment of a redundant row decoder 28 of FIG. 2 according to the invention. The decoder 28 is similar in structure and operation to the matrix row decoder 22 of FIG. 7. In this embodiment, the redundant circuit 24 can handle up to four redundant rows, and thus four redundant row decoders 28. But one can modify the decoder 22 according to conventional circuit design principles so that the circuit 24 can accommodate more than four redundant rows. The decoder 28 includes a PMOS transistor 100 having a gate coupled to receive PRECHARGE, an inverter 102 for firing the redundant word line RWL, and three serially connected NMOS transistors 104, 106, and 108. The transistors 104 and 106 receive redundant address bits RA1 and RA2, respectively, from the redundant address bus 30 (FIG. 2), and the transistor 108 receives a respective REDUNDANT CONTROL signal from the redundant match circuit 86 (FIG. 6).

During testing of the IC 40 (FIG. 2), if one wishes to replace a defective matrix row with the redundant row corresponding to the decoder 28, then he enables the decoder 28 by programming the redundant control circuit 32 to generate REDUNDANT CONTROL equal to logic 1. He also programs the redundancy address circuit 30 to generate RA1 and RA2 equal to logic 1 whenever the address generator 18 generates the address of the defective matrix row. Conversely, if one does not wish to use the redundant row to replace a defective matrix row, he disables the decoder 28 by programming the circuit 32 to generate REDUNDANT CONTROL equal to logic 0.

In operation, before the row address generator 18 (FIG. 2) generates the row address on the bus 20, PRECHARGE transitions from logic 1 to logic 0 to turn on the transistor 100. The NMOS transistors 104 and 106 (and possibly the transistor 108) are off so that the transistor 100 charges the input terminal of the inverter 102 to logic 1. PRECHARGE then transitions back to logic 1 to turn off the transistor 100 and the address generator 18 generates a matrix-row address on the bus 20. If REDUNDANT CONTROL equals logic 0, then the decoder 28 cannot fire the redundant word line RWL regardless of the values of the redundant address bits RA1 and RA1. Specifically, the logic 0 turns off the transistor 108, which acts as an open circuit between the input terminal of the inverter 102 and ground. This open circuit causes the input of the inverter 102 to remain at logic 1, which causes the inverter 102 to generate inactive logic 0 on the row line RWL. If REDUNDANT CONTROL equals logic 1, but none or only one of the bits RA1 and RA2 equal logic 1, then at least one of the transistors 104 and 106 is turned off. Therefore, there is still an open circuit between the input terminal of the inverter 102 and ground, and the inverter 102 still generates inactive logic 0 on RWL. Conversely, if REDUNDANT CONTROL, RA1, and RA2 equal logic 1, then all three transistors 104, 106, and 108 are on and together pull the input of the inverter 102 to ground. This causes the inverter 102 to fire the row by generating active logic 1 on RWL.

Figure 9:
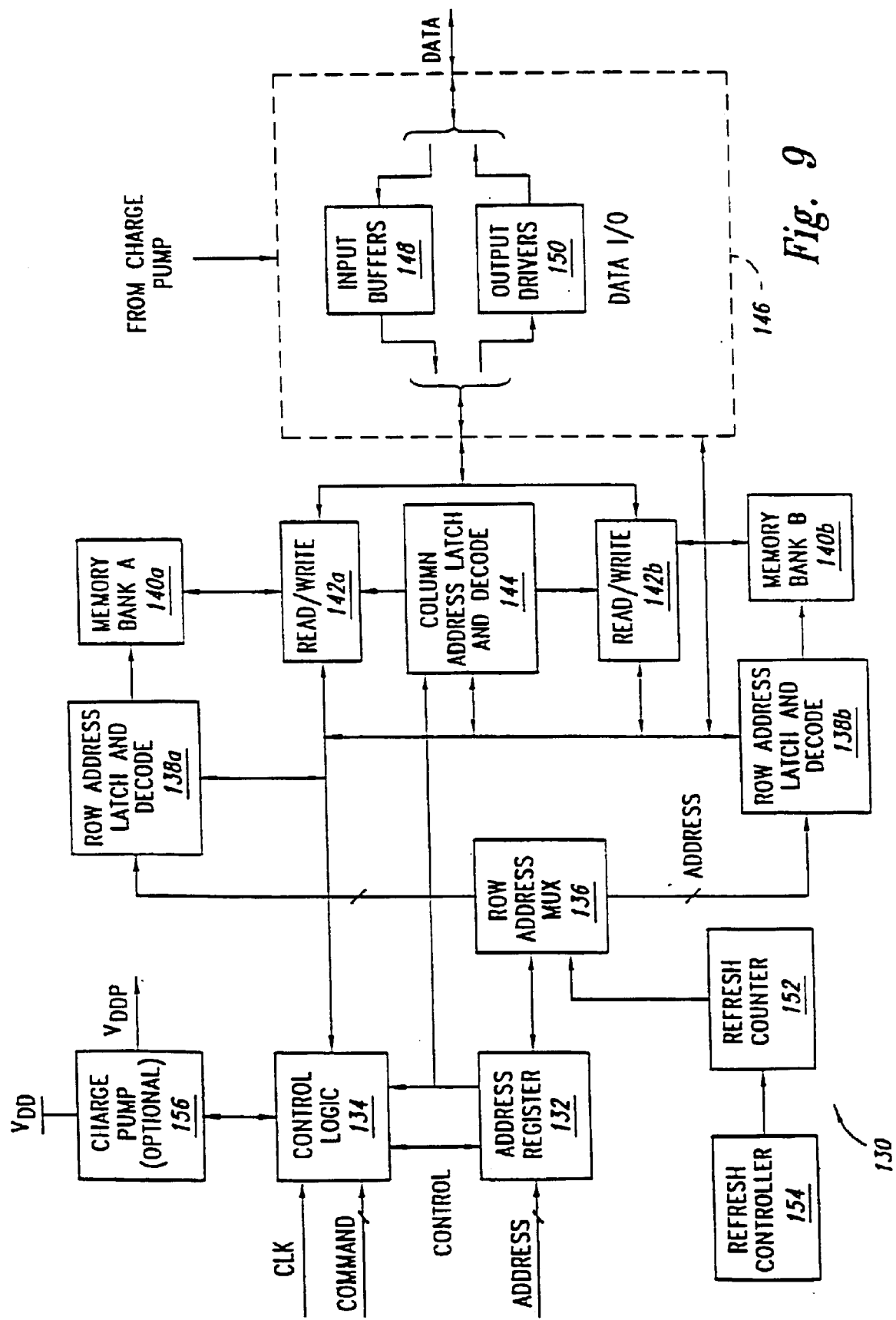
FIG. 9 is a block diagram of an embodiment of a memory circuit that includes the fuse bank of FIGS. 4A and 4B.

FIG. 9 is a block diagram of a memory circuit 130, which includes the fuse bank 60 of FIGS. 4A and 4B or the matrix and redundant control circuits 42 and 32 of FIGS. 5 and 6, respectively.

The memory circuit 130 includes an address register 132, which receives an address from an ADDRESS bus. A control logic circuit 134 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 130. A row address multiplexer 136 receives the address signal from the address register 132 and provides the row address to the row-address latch-and-decode circuits 138a and 138b for the memory bank 140a or 140b, respectively. In one embodiment, the multiplexer 136 includes the address generator 18 (FIG. 2), and the circuits 138a and 138b each include the matrix and redundant control circuits 42 and 32 (FIGS. 5 and 6, respectively).

During read and write cycles, the row-address latch-and-decode circuits 138a and 138b activate the word lines of the addressed rows of memory cells in the memory banks 140a and 140b, respectively. Read/write circuits 142a and 142b read data from the addressed memory cells in the memory banks 140a and 140b, respectively, during a read cycle, and write data to the addressed memory cells during a write cycle. A column-address latch-and-decode circuit 144 receives the address from the address register 132 and provides the column address of the selected memory cells to the read/write circuits 142a and 142b. For clarity, the address register 132, the row-address multiplexer 136, the row-address latch-and-decode circuits 138a and 138b, and the column-address latch-and-decode circuit 144 can be collectively referred to as an address decoder.

A data input/output (I/O) circuit 146 includes a plurality of input buffers 148. During a write cycle, the buffers 148 receive and store data from the DATA bus, and the read/write circuits 142a and 142b provide the stored data to the memory banks 140a and 140b, respectively. The data I/O circuit 146 also includes a plurality of output drivers 150. During a read cycle, the read/write circuits 142a and 142b provide data from the memory banks 140a and 140b, respectively, to the drivers 150, which in turn provide this data to the DATA bus.

A refresh counter 152 stores the address of the row of memory cells to be refreshed either during a conventional auto-refresh mode or self-refresh mode. After the row is refreshed, a refresh controller 154 updates the address in the refresh counter 152, typically by either incrementing or decrementing the contents of the refresh counter 152 by one. Although shown separately, the refresh controller 154 may be part of the control logic 134 in other embodiments of the memory circuit 130.

The memory circuit 130 may also include an optional charge pump 156, which steps up the power-supply voltage $V_{DD}$ to a voltage $V_{DDP}$. In one embodiment, the pump 156 generates $V_{DDP}$ approximately 1–1.5 V higher than $V_{DD}$. The memory circuit 130 may also use $V_{DDP}$ to conventionally overdrive selected internal transistors.

Although an embodiment of the row-address latch-and-decode circuits 138a and 138b is described as including the matrix and redundant control circuits 42 and 32 (FIGS. 5 and 6, respectively), any portion of the memory circuit 130 can include the fuse bank 60 (FIGS. 4A and 4B).

Figure 10:
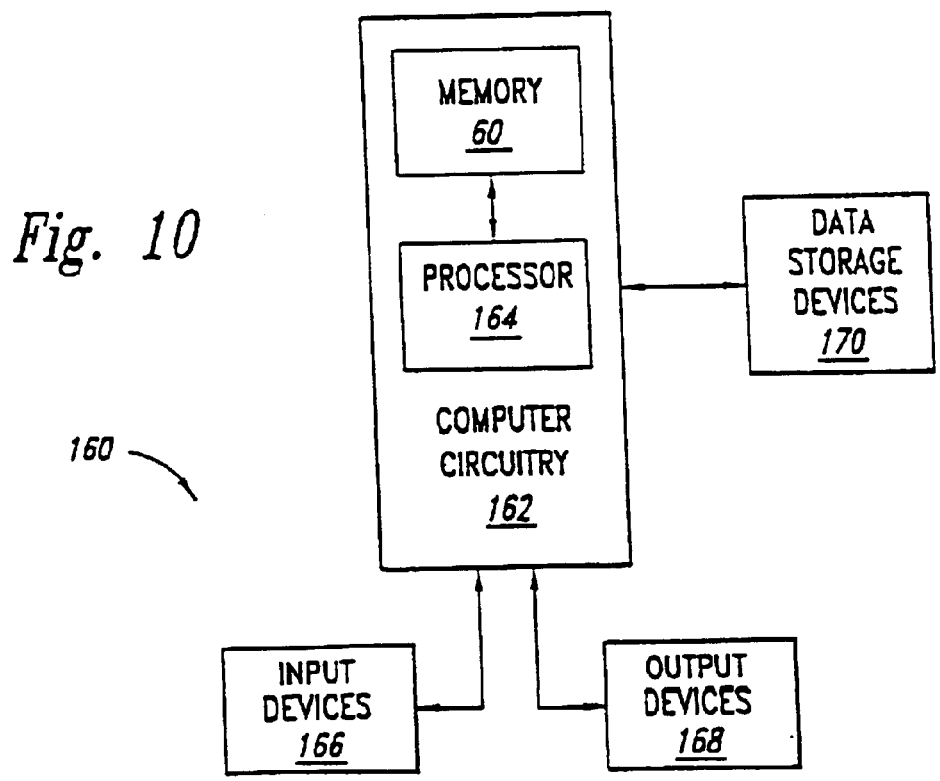
FIG. 10 is a block diagram of an electronic system that includes the memory circuit of FIG. 9.

FIG. 10 is a block diagram of an electronic system 160, such as a computer system, that includes the memory circuit 130 of FIG. 9. The system 160 includes computer circuitry 162 for performing computer functions, such as executing software to perform desired calculations and tasks. The circuitry 162 typically includes a processor 164 and the memory circuit 130, which is coupled to the processor 164. One or more input devices 166, such as a keyboard or a mouse, are coupled to the computer circuitry 162 and allow an operator (not shown) to manually input data thereto. One or more output devices 168 are coupled to the computer circuitry 162 to provide to the operator data generated by the computer circuitry 162. Examples of such output devices 168 include a printer and a video display unit. One or more data-storage devices 170 are coupled to the computer circuitry 162 to store data on or retrieve data from external storage media (not shown). Examples of the storage devices 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory circuit 130.

From the foregoing it will be appreciated that, although specific embodiments of the invention have been described herein for purposes of illustration, various modifications may be made without deviating from the spirit and scope of the invention.

What is claimed:

1. A method of forming fuses in a semiconductor integrated circuit formed on a semiconductor substrate, the method comprising:

forming a first conductive layer over the substrate;

forming a first group of fuses in the first conductive layer, the first group of fuses occupying a first area of the first conductive layer;

forming an insulating layer on the first conductive layer;

forming a second conductive layer on the insulating layer; and forming a second group of fuses in the second conductive layer, the second group of fuses occupying a second area of the second conductive layer and being positioned to at least partially overlap the first area.

2. The method of claim 1 wherein the first and second conductive layers comprise polysilicon.

3. The method of claim 1 wherein each fuse in the first group is aligned with a corresponding fuse in the second group.

4. The method of claim 1 further comprising forming additional groups of fuses in additional conductive layers, each group having an area that at least partially overlaps the area of another group, and wherein additional insulating layers are formed between the additional conductive layers.

5. The method of claim 1 wherein the semiconductor substrate comprises silicon.

6. The method of claim 1 wherein each of the fuses is programmed through an applied energy beam.

7. The method of claim 6 wherein the applied energy beam comprises a laser beam.

8. The method of claim 6 wherein some of the fuses are operable to open responsive to an energy beam having a first frequency and other ones of the fuses are operable to open responsive to an energy beam having a second frequency.

9. A method of forming a semiconductor device on a substrate, the method comprising:

forming a first conductive layer over the substrate;

forming a first fuse region in the first conductive layer;

forming an insulating layer on the first conductive layer including the fuse region;

forming a second conductive layer on the insulating layer;

forming a second fuse region in the second conductive layer, at least a portion of the second fuse region overlapping the first fuse region;

forming MOS transistors on the substrate; and interconnecting each of the first and second fuse regions with a respective MOS transistor.

10. The method of claim 9 wherein the first and second fuse regions comprise aluminum.

11. The method of claim 10 wherein each of the fuses is programmed through an applied energy beam.

12. The method of claim 9 wherein the semiconductor substrate comprises silicon.

13. A method of operating a semiconductor memory device formed on a substrate, the memory device including an array of memory cells including primary and redundant memory cells, and the memory device further including read/write and address circuitry, the method comprising:

forming a first group of fuses in a first conductive layer over the substrate, the first group of fuses occupying a first area of the first conductive layer;

forming an insulating layer on the first conductive layer;

forming a second conductive layer on the insulating layer; and forming a second group of fuses in the second conductive layer, the second group of fuses occupying a second area of the second conductive layer and being positioned to at least partially overlap the first area;

selectively programming the fuses in the first and second groups;

receiving and decoding addresses corresponding to memory cells in the array; and for each address, accessing either primary or redundant memory cells corresponding to the address responsive to the states of the programmed fuses.

14. The method of claim 13 wherein selectively programming the fuses in the first and second groups comprises detecting defective primary memory cells and mapping redundant cells to detected primary memory cells.

15. The method of claim 13 wherein the first and second conductive layers comprise polysilicon.

16. The method of claim 13 wherein each fuse in the first group is aligned with a corresponding fuse in the second group.

17. The method of claim 13 further comprising forming additional groups or fuses in additional conductive layers, each group having an area that at least partially overlaps the area of another group, and wherein additional insulating layers are formed between the additional conductive layers.

18. The method of claim 13 wherein the semiconductor substrate comprises silicon.

19. The method of claim 13 wherein each of the fuses is programmed through an applied energy beam.

20. A method of forming fuse elements in a semiconductor integrated circuit formed on a substrate, the method comprising:

forming a first conductive layer over the substrate;

forming a plurality of independent conductive regions in the first conductive layer, each region being electrically isolated from the other regions and corresponding to a first fuse element;

forming an insulating layer on the first conductive layer;

forming a second conductive layer on the insulating layer; and forming a plurality of independent conductive regions in the second conductive layer, each region being electrically isolated from the other regions and corresponding to a second fuse element, and at least one of the second fuse elements being positioned to at least partially overlap a first fuse element or elements in the first conductive layer.

21. The method of claim 20 wherein the first and second conductive layers comprise polysilicon.

22. The method of claim 20 wherein each of the first fuse elements is aligned with a corresponding one of the second fuse elements.

23. The method of claim 20 further comprising forming additional independent conductive regions in additional conductive layers, each additional region being positioned to at least partially overlap a fuse element or elements in one of the other layers, and wherein additional insulating layers are formed between the additional conductive layers.

* * * * *